(12) United States Patent
Zhang et al.

(10) Patent No.: US 8,829,789 B2
(45) Date of Patent: *Sep. 9, 2014

(54) ORGANIC OPTOELECTRONIC DEVICE ELECTRODES WITH NANOTUBES

(71) Applicant: The University of Southern California, Los Angeles, CA (US)

(72) Inventors: Daihua Zhang, Palo Alto, CA (US); Koungmin Ryu, Los Angeles, CA (US); Xiaolei Liu, Los Angeles, CA (US); Evgueni Polikarpov, Los Angeles, CA (US); James Ly, Los Angeles, CA (US); Mark E. Thompson, Anaheim, CA (US); Chongwu Zhou, Rowland Heights, CA (US); Cody Schlenker, Los Angeles, CA (US)

(73) Assignee: The University of Southern California, Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/657,354

(22) Filed: Oct. 22, 2012

(65) Prior Publication Data

US 2013/0059406 A1    Mar. 7, 2013

Related U.S. Application Data

(60) Division of application No. 12/898,162, filed on Oct. 5, 2010, now abandoned, and a continuation of application No. 11/779,638, filed on Jul. 18, 2007, now Pat. No. 7,834,545.

(60) Provisional application No. 60/831,710, filed on Jul. 18, 2006.

(51) Int. Cl.
*H01L 51/50* (2006.01)
*H01L 51/00* (2006.01)
*H01L 51/44* (2006.01)
*B82Y 10/00* (2011.01)
*H01L 51/52* (2006.01)

(52) U.S. Cl.
CPC .......... *H01L 51/0003* (2013.01); *Y10S 977/742* (2013.01); *Y02E 10/549* (2013.01); *H01L 51/0048* (2013.01); *H01L 51/0081* (2013.01); *H01L 51/0037* (2013.01); *H01L 51/444* (2013.01); *B82Y 10/00* (2013.01); *H01L 51/006* (2013.01); *H01L 51/5088* (2013.01); *H01L 51/5206* (2013.01)
USPC .......................................... 313/506; 977/742

(58) Field of Classification Search
CPC ....................................................... B82Y 10/00
USPC ......................................................... 313/506
See application file for complete search history.

(56) References Cited

U.S. PATENT DOCUMENTS 5,703,436 A    12/1997   Forrest et al.
5,707,745 A    1/1998    Forrest et al.
(Continued)

FOREIGN PATENT DOCUMENTS

WO    2007004758    1/2007

OTHER PUBLICATIONS

S. Kazaoui et al, "Near-infrared electroluminescent devices using single-wall carbon nanotubes thin films". Appl. Phys. Letters v. 87, 211914, 2005.

(Continued)

*Primary Examiner* — Anh Mai
*Assistant Examiner* — Hana Featherly
(74) *Attorney, Agent, or Firm* — Duane Morris LLP

(57) ABSTRACT

An electrode for use in an organic optoelectronic device is provided. The electrode includes a thin film of single-wall carbon nanotubes. The film may be deposited on a substrate of the device by using an elastomeric stamp. The film may be enhanced by spin-coating a smoothing layer on the film and/or doping the film to enhance conductivity. Electrodes according to the present invention may have conductivities, transparencies, and other features comparable to other materials typically used as electrodes in optoelectronic devices.

15 Claims, 14 Drawing Sheets

(56) References Cited

U.S. PATENT DOCUMENTS

| | | | |
|---|---|---|---|
| 5,844,363 | A | 12/1998 | Gu et al. |
| 6,303,238 | B1 | 10/2001 | Thompson et al. |
| 6,352,777 | B1 | 3/2002 | Bulovic et al. |
| 6,580,027 | B2 | 6/2003 | Forrest et al. |
| 6,657,378 | B2 | 12/2003 | Forrest et al. |
| 6,949,877 | B2 | 9/2005 | Sun et al. |
| 7,074,980 | B2 | 7/2006 | Prato et al. |
| 7,214,553 | B2 | 5/2007 | Legagneux et al. |
| 7,358,538 | B2 | 4/2008 | Lu et al. |
| 7,466,071 | B2 | 12/2008 | Oh et al. |
| 7,834,545 | B2 | 11/2010 | Zhang et al. |
| 2002/0074932 | A1* | 6/2002 | Bouchard et al. ............ 313/495 |
| 2003/0007110 | A1* | 1/2003 | Fujimoto et al. ............ 349/106 |
| 2004/0197546 | A1 | 10/2004 | Rinzler et al. |
| 2004/0214041 | A1 | 10/2004 | Lu et al. |
| 2004/0241896 | A1* | 12/2004 | Zhou et al. .................... 438/48 |
| 2005/0156504 | A1* | 7/2005 | Takai et al. .................. 313/495 |
| 2005/0171281 | A1 | 8/2005 | Hwang et al. |
| 2006/0228543 | A1 | 10/2006 | Lu et al. |
| 2006/0292362 | A1 | 12/2006 | Hsu et al. |
| 2007/0120095 | A1 | 5/2007 | Gruner |
| 2009/0142581 | A1 | 6/2009 | Heintz et al. |
| 2010/0065829 | A1 | 3/2010 | Forrest et al. |

OTHER PUBLICATIONS

Zhihua Xu et al, "Carbon nanotube effects on electroluminescence and photovoltaic response in conjugated polymers", Appl. Phys. Letters v. 87, 263118, 2005.

R.C. Haddon et al., "Purification and Separation of Carbon Nanotubes", MRS Bulletin, Apr. 2004, pp. 252-259.

Ryu et al, "Transparent, conductive and Flexible Carbon Nanotube Films and Their Application in Organic Light Emitting Diodes," Mater. Res. Soc. Symp. Proc., vol. 936, 2006.

Minami et al., "Optical Properties of Semiconducting and Metallic Single Wall Carbon Nanotubes: Effects of Doping and High pressure," Synthetic Metals, Elsevier Sequoia, Lausanne, CH,vol. 116, pp. 405-409, XP002973267, ISSN: 0379-6779 (Jan. 1, 2001).

Aurelien Du Pasquier et al, "Conducting and transparent single-wall carbon nanotube electrodes for polymer-fullerene solar cells," App. Phys. Letters, 87, 203511 (2005).

Zhuangchun Wu et al., "Transparent, Conductive Carbon Nanotube Films", Science, v. 305, No. 5688, p. 1273-76, Aug. 27, 2004.

Mei Zhang et al, "Strong, Transparent, Multifunctional, Carbon Nanotube Sheets," Science, v. 309, No. 5738, pp. 1215-1219, Aug. 19, 2005.

Elena Bekyarova et al, "Electronic Properties of Single-Walled Carbon Nanotube Networks," J. Amer. Chem. Soc., v. 127 No. 16, pp. 5990-5995, Apr. 27, 2005.

Urszula Dettlaff-Weglikowska et al, "Effect of SoCl2 Treatment on Electrical and Mechanical Properties of Single-Wall Carbon Nanotube Networks", J. Amer. Chem. Soc. v. 127, No. 14 pp. 5125-5131, Apr. 13, 2005.

I.W. Chiang et al, "Purification and Characterization of Single-Wall Carbon Nanotubes (SWNTs) Obtained from the Gas-Phase Decomposition of CO (HiPco Process)," J. Phys. Chem B. v. 105, No. 35, pp. 8297-8301, Sep. 6, 2001.

H.S. Woo et al, Hole blocking in carbon nanotube-polymer composite organic light-emitting diodes based on poly (m-phenylene vinylene-co-2, 5-dioctoxy-p-phenylene vinylene). Appl. Phys. Letters, v. 77. No. 9, 1393, Aug. 28, 2000.

Walt A. DeHeer et al., "Aligned Carbon Nanotube Films: Production and Optical and Electrical Properties," Science, v. 268, pp. 845-847, May 12, 1995.

Andreas Thess et al, "Crystaline Ropes of Metallic Carbon Nanotubes," Science, v. 273, pp. 483-87, Jul. 26, 1996.

Danilo B. Romero et al, "A Carbon Nanotube/Organic Semiconducting Polymer Heterojunction," Adv. Mater., v. 8, No. 11, pp. 899-902, 1996.

P. Fournet et al, "Enhanced brightness in organic light-emitting diodes using a carbon nanotube composite as an electron transport layer", J. Appl. Phys., v. 90, No. 2, Jul. 15, 2001, pp. 969-975.

P. Fournet et al, "A carbon nanotube composite as an electron transport layer for M3EH-PPV based light-emiting diodes", Synth. Mater. v. 121, pp. 1683-1684, 2001.

Jae-Yoo Kim et al, "Characterization of light emitting devices based on a single-walled carbon nanotube-polymer composite", Symth. Mater. v. 139, pp. 565-568, 2003.

Young-Geun Ha et al, "Fabrication and characterization of OLEDs using MEH-PPV and SWCNT nanocomposite", Synth. Mater. v. 153, pp. 205-208, 2005.

Yangzin Zhou et al, "A method of printing carbon nanotube thin films", Appl. Phys. Letters v. 88, 123109, 2006 pp. 123109-1-123109-3.

International Search Report dated Oct. 12, 2008 for corresponding PCT Application No. PCT/US2007/016334.

* cited by examiner

FIG. 4A
FIG. 4B
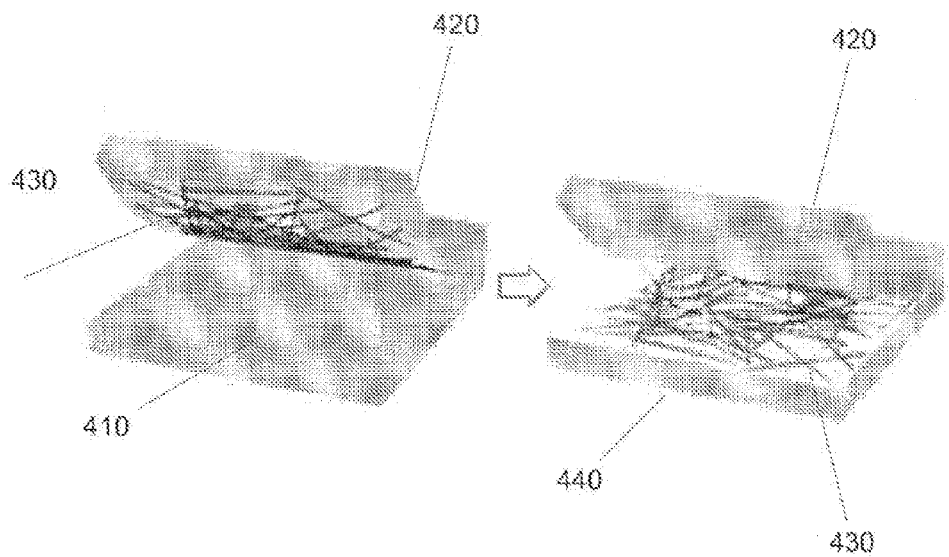
FIG. 4C
FIG. 4D
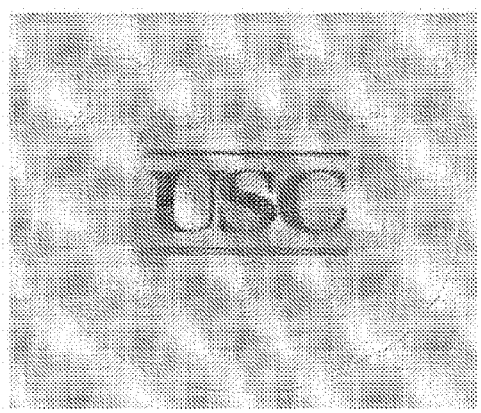
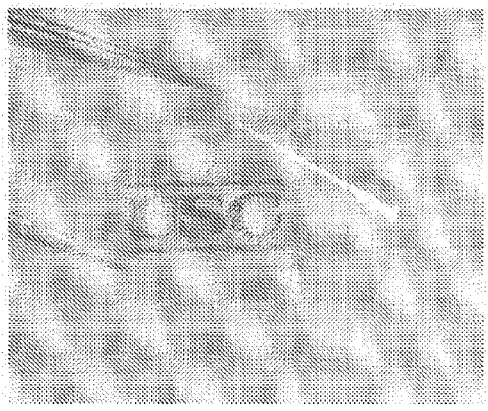

1 µm

1 µm

ORGANIC OPTOELECTRONIC DEVICE ELECTRODES WITH NANOTUBES

RELATED APPLICATIONS

This application is a divisional of co-pending U.S. patent application Ser. No. 12/898,162, filed on Oct. 5, 2010 which is a continuation of U.S. patent application Ser. No. 11/779,638, filed on Jul. 18, 2007, now U.S. Pat. No. 7,834,545 issued on Nov. 16, 2010, which claims the benefit of U.S. Provisional Application No. 60/831,710 filed Jul. 18, 2006, the disclosures of which are incorporated herein by reference in their entirety.

GOVERNMENT RIGHTS

This invention was made with U.S. Government support under Contract No. N66001-04-1-8902 awarded by the Defense Advance Research Projects Agency MolApps Program. The government has certain rights in this invention.

JOINT RESEARCH AGREEMENT

The claimed invention was made by, on behalf of, and/or in connection with one or more of the following parties to a joint university corporation research agreement: Princeton University, The University of Southern California, the Universal Display Corporation, and the Global Photonic Energy Corporation. The agreement was in effect on and before the date the claimed invention was made, and the claimed invention was made as a result of activities undertaken within the scope of the agreement.

FIELD OF THE INVENTION

The present invention relates to organic optoelectronic devices. More specifically, it relates to organic optoelectronic devices incorporating nanotubes.

BACKGROUND

Optoelectronic devices rely on the optical and electronic properties of materials to either produce or detect electromagnetic radiation electronically or to generate electricity from ambient electromagnetic radiation. Examples of organic optoelectronic devices include organic light emitting devices (OLEDs), organic phototransistors, organic photovoltaic (PV) cells, and organic photodetectors.

As used herein, the term "organic" includes polymeric materials as well as small molecule organic materials that may be used to fabricate organic optoelectronic devices. "Small molecule" refers to any organic material that is not a polymer, and "small molecules" may actually be quite large. Small molecules may include repeat units in some circumstances. In general, a small molecule has a well-defined chemical formula with a single molecular weight, whereas a polymer has a chemical formula and a molecular weight that may vary from molecule to molecule.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally intended to emit light through at least one electrode, and one or more transparent electrodes may be useful in an organic optoelectronic devices. For example, an electrode may comprise a transparent electrode material, such as indium tin oxide (ITO). Transparent top electrodes are further described in U.S. Pat. Nos. 5,703,436 and 5,707,745, which are incorporated by reference in their entireties. For a device intended to emit light only through the bottom electrode, the top electrode does not need to be transparent, and may comprise a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

Photosensitive optoelectronic devices convert electromagnetic radiation into an electrical signal or electricity. An organic photosensitive device typically includes at least one photoactive region in which light is absorbed to form an exciton, which may subsequently dissociate into an electron and a hole. The "photoactive region" is a portion of a photosensitive device that absorbs electromagnetic radiation to generate excitons that may dissociate in order to generate an electrical current. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation. Organic photosensitive devices, including their general construction, characteristics, materials, and features, are further described in U.S. Pat. No. 6,657,378 to Forrest et al., U.S. Pat. No. 6,580,027 to Forrest et al., and U.S. Pat. No. 6,352,777 to Bulovic et al., each of which is incorporated herein by reference in its entirety.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

SUMMARY

A layer for use in an organic optoelectronic device is provided. The layer includes a thin film of single-wall carbon nanotubes. The film may be deposited on a substrate of the device by using an elastomeric stamp. The film may be enhanced by spin-coating a smoothing layer on the film and/or doping the film to enhance conductivity. When the layer is

BRIEF DESCRIPTION OF THE DRAWINGS

FIGS. 4A-4B show a thin film of nanotubes transferred to a substrate using an elastomeric stamp.
FIG. 4C shows a transparent 40 nm thick single-wall nanotube film on a 2" diameter glass substrate.
FIG. 4D shows a flexed single-wall nanotube film on a polyester sheet.

DETAILED DESCRIPTION

Figure 1:
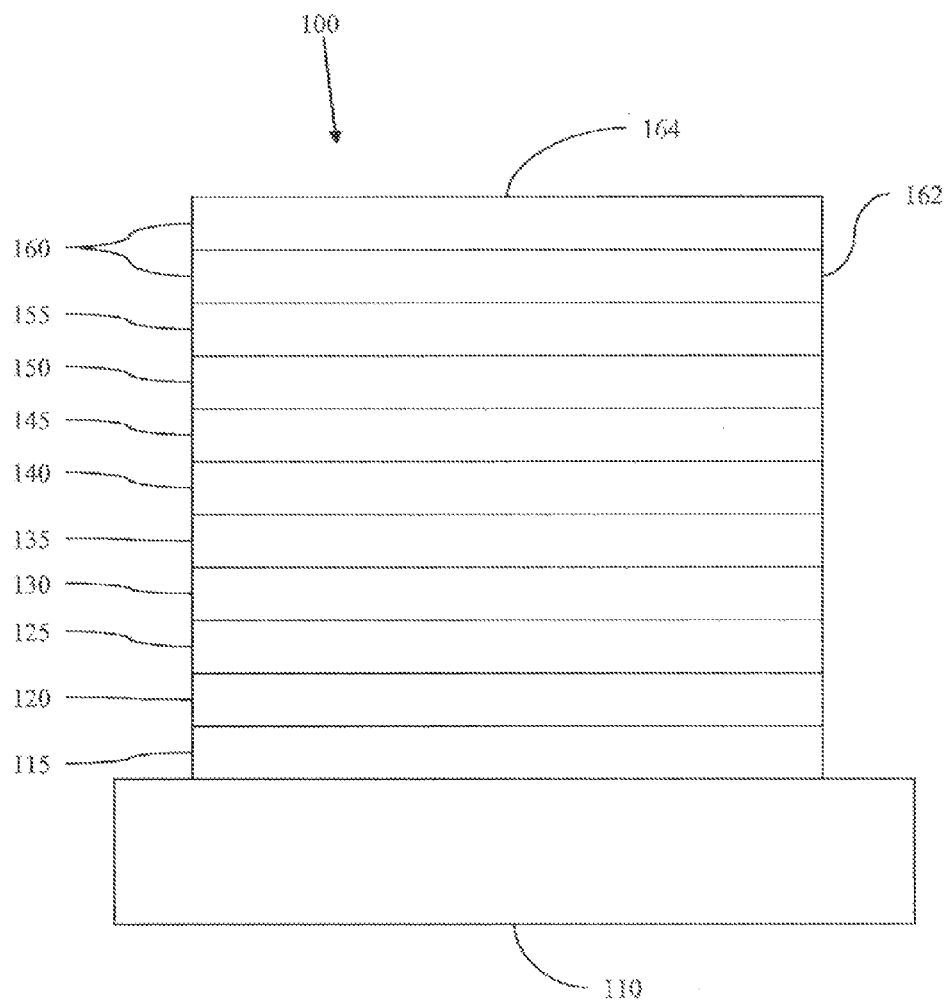
FIG. 1 shows an exemplary organic light emitting device.

FIG. 1 shows an exemplary organic light emitting device 100. The figures are not necessarily drawn to scale. The device 100 may include a substrate 110, an anode 115, a thin film of single-walled nanotubes 116, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 may be a compound cathode having a first conductive layer 162 and a second conductive layer 164. Device 100 may be fabricated by depositing the layers described, in order.

Figure 2:
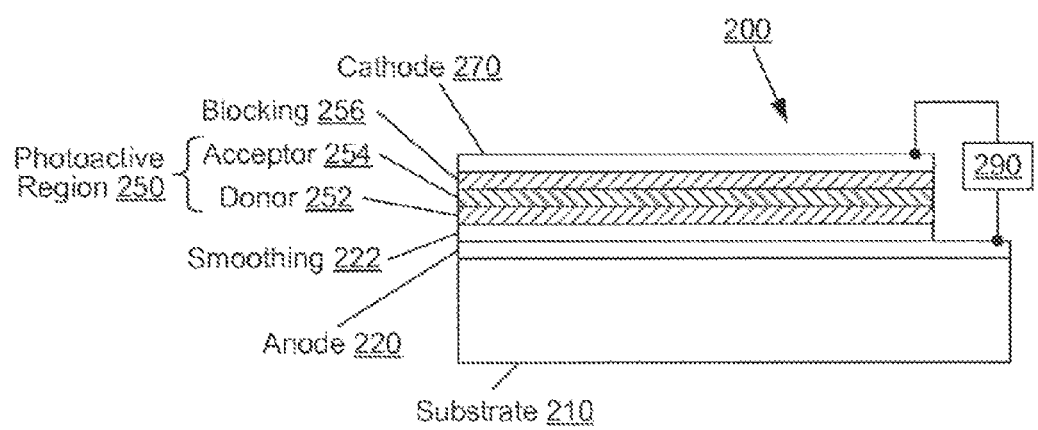
FIG. 2 shows an exemplary organic photosensitive device.

FIG. 2 shows an exemplary organic photosensitive device 200. A photoactive region 250 comprises a donor-acceptor heterojunction. Device 200 comprises an anode 220, a thin film of single-walled nanotubes 221, an anode smoothing layer 222, a donor 252, an acceptor 254, an exciton blocking layer ("EBL") 256, and a cathode 270, over a substrate 210. The devices as illustrated may be connected to an element 290. If the device is a photovoltaic device, element 290 is a resistive load which consumes or stores power. If the device is a photodetector, element 290 is a current detecting circuit which measures the current generated when the photodetector is exposed to light, and which may apply a bias to the device (as described for example in Published U.S. Pat. No. 6,972,431 to Forrest et al., which is incorporated by reference in its entirety). Unless otherwise stated, each of these arrangements and modifications may be used for the devices in each of the drawings and embodiments disclosed herein. If a photoactive region includes a mixed layer or bulk layers and one or both of the donor and acceptor layers, the photoactive region is said to include a "hybrid" heterojunction. For additional explanation of hybrid heterojunctions, Published U.S. Patent Application 2005/0224113 A1, entitled "High efficiency organic photovoltaic cells employing hybridized mixed-planar heterojunctions" by Jiangeng Xue et al., published Oct. 13, 2005, is hereby incorporated by reference.

Substrates 110, 210 on which optoelectronic devices are fabricated may comprise any suitable substrate material that provides desired structural properties. Substrates used with the invention may be flexible or rigid and transparent, translucent or opaque. Exemplary substrate materials include plastic, glass, metal foils, and semiconductor materials. For example, a substrate may comprise a silicon wafer upon which circuits are fabricated, capable of controlling devices subsequently deposited on the substrate. Other substrates may be used. The material and thickness of the substrate may be chosen to obtain desired structural and optical properties.

The term "electrode" is used herein to refer to a layer that provides a medium for delivering photo-generated current to an external circuit or providing a current or voltage to a device. As illustrated in FIGS. 1 and 2, anodes 115, 220 and cathodes 160, 270 are exemplary electrodes. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each of which is incorporated herein by reference for disclosure of these respective features. As used herein, an electrode or other layer is said to be "transparent" if it transmits at least 50% of the ambient electromagnetic radiation in a relevant wavelength.

In some configurations, devices according to the present invention may include one or more conventional anodes in addition to the electrodes and other layers described herein. Anodes used in the present invention may comprise any suitable anode material that is sufficiently conductive to transport holes. Exemplary anode materials include conductive metal oxides, such as indium tin oxide (ITO) and indium zinc oxide (IZO), aluminum zinc oxide (AlZnO), and metals. Anodes may be sufficiently transparent to create a bottom-emitting device. An exemplary transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anodes may be opaque and/or reflective. A reflective anode may be preferred for some top-emitting devices, to increase the amount of light emitted from the top of the device. The material and thickness of an anode may be chosen to obtain desired conductive and optical properties. For a transparent anode, there may be a range of thickness for a particular material that is thick enough to provide the desired conductivity, yet thin enough to provide the desired degree of transparency. Other anode materials and structures may be used.

In some configurations, devices according to the present invention may include one or more conventional cathodes in addition to the electrodes and other layers described herein. Cathodes used with the present invention may comprise any suitable material or combination of materials known to the art, such that the cathode is capable of conducting electrons. Cathodes may be transparent or opaque, and may be reflective. Metals and metal oxides are examples of suitable cathode materials. Cathodes may be a single layer, or may have a compound structure. For example, FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose other exemplary cathodes. Other cathode materials and structures may be used.

Various other layers may be present in optoelectronic devices according to the invention. Transport layers may be used to transport charge carriers from one layer to another, such as from an electrode or an injection layer to the emissive layer. Examples of hole and electron transport layers are disclosed in U.S. Patent Application Pub. No. 2003-0230980 to Forrest et al., which is incorporated by reference in its entirety. Other hole and/or electron transport layers may be used. Injection layer materials may be distinguished from conventional transporting materials in that such materials may have a charge carrier conductivity that is substantially less than the conductivity of conventional transporting materials. Injection layers may also perform a charge transport function. Detailed descriptions and examples of injection layers and transport layers are given in U.S. Pat. No. 7,053,547 to Lu et al., which is incorporated herein by reference it its entirety. More examples of injection layers are provided in U.S. Pat. No. 7,071,615 to Lu et al., which is incorporated by reference in its entirety. Blocking layers may provide a barrier that significantly inhibits transport of charge carriers and/or excitons through the device, without necessarily completely blocking the charge carriers and/or excitons. The theory and use of blocking layers, and further examples of specific blocking layers, are described in more detail in U.S. Pat. No. 6,097,147, U.S. Patent Application Publication No. 2003-0230980 to Forrest et al., and U.S. Pat. No. 6,451,415 to Forrest et al., which are incorporated by reference in their entireties. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000).

In emissive devices such as OLEDs, an emissive layer may include an organic material capable of emitting light when a current is passed through the layer. Preferably, an emissive layer contains a phosphorescent emissive material, although fluorescent emissive materials may also be used. An emissive layer may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Further examples of emissive and host materials are disclosed in U.S. Pat. No. 6,303,238 to Thompson et al., which is incorporated by reference in its entirety. Other emissive layer materials and structures may be used.

An organic photosensitive optoelectronic device may include charge transfer layers, electrodes, and/or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; Published U.S. Patent Application 2006-0032529 A1, entitled "Organic Photosensitive Devices" by Rand et al., published Feb. 16, 2006; and Published U.S. Patent Application 2006-0027802 A1, entitled "Stacked Organic Photosensitive Devices" by Forrest et al., published Feb. 9, 2006; each incorporated herein by reference for its disclosure of recombination zone materials and structures. An electrode or charge transfer layer may serve as a Schottky contact.

Optoelectronic devices may include stacked and/or tandem configurations, such as the stacked OLED configurations described in U.S. Pat. No. 5,707,745 to Forrest et al., and the tandem PV cells described in U.S. Pat. Nos. 6,198,091, 6,198,092, and 6,270,855, each of which is incorporated by reference in its entirety.

Protective and/or smoothing layers may be used in organic optoelectronic devices. A more detailed description of protective layers may be found in U.S. Pat. No. 7,071,615 to Lu et al., which is incorporated by reference in its entirety. Smoothing layers are described in U.S. Pat. No. 6,657,378 to Forrest et al., which is incorporated by reference in its entirety.

The performance of optoelectronic devices may be enhanced by incorporating carbon nanotubes (CNTs) into polymer matrices as a dopant material. Generally, CNTs are seamless cylindrical arrangements of carbon atoms. A single-wall carbon nanotube (SWNT) is a one-atom thick sheet of graphite (graphene) in a cylindrical configuration. A SWNT typically has a diameter of the order of a nanometer, and can have a length-to-diameter ratio of over 10,000. Multi-wall nanotubes typically are of two types. In the first type, a graphene sheet is arranged in a rolled cylindrical configuration, where the length of the sheet is longer than the circumference of the resulting nanotube. That is, the sheet overlaps itself, and can form multiple layers on and within the nanotube. In the second type, multiple SWNT structures of different radii are arranged concentrically around a common long axis.

It has been found that the combination of CNTs with polymers may reinforce polymer films and/or also introduce new electronic properties based on morphological modification or electronic interaction between the two components. The effect of CNT doping has been investigated by embedding CNT powders in the emission, electron-transport and hole-transport layers of OLEDs. By introducing additional energy levels or forming carrier traps in the host polymers, the CNT dopant can selectively facilitate or block the transport of charge carriers, and may improve OLED performance at optimized dopant concentrations.

Continuous CNT films may complement indium-tin oxide (ITO) for certain applications, including organic light emitting diodes and organic photovoltaic (OPV) devices. For example, CNT films may be bent to acute angles without fracture; in contrast, ITO films typically are not as flexible. In addition, while carbon is the most abundant element in nature, the world-wide production of indium is limited, which may soon cause difficulty in meeting an ever-increasing demand for large-area transparent conductive electrodes. CNT films also may offer additional advantages such as tunable electronic properties through chemical treatment and enhanced carrier injection owing to the large surface area and field-enhanced effect at the nanotube tips and surfaces.

Carbon nanotubes may be single-walled or multi-walled. Multi-walled nanotubes contain multiple layers of graphite arranged concentrically in a tube. Generally, single-walled nanotubes (SWNTs) exhibit better electrical properties than multi-walled nanotubes. SWNTs commercially available in bulk quantity are generally manufactured using either a high-pressure carbon monoxide (HiPCO) process (such as HiPCO nanotubes are available from Carbon Nanotechnology Inc.) or an arc-discharge process (such as P3 nanotubes from Carbon Solutions Inc., which are purified arc-discharge nanotubes with two open ends linked with hydrophilic carboxyl groups). To form HiPCO SWNTs, a flow of carbon monoxide gas is pumped through a chamber containing clusters of a catalyst such as iron. The catalyst splits the carbon monoxide into carbon and oxygen. Some of the carbon recombines with the oxygen to form carbon dioxide; the remaining carbon bonds into a nanotube structure. In an arc-discharge process, carbon rods are placed end to end, separated by about 1 mm, in a chamber containing an inert gas. A direct current is applied to create a high temperature discharge (arc) between the two electrodes. The carbon surface of one electrode is vaporized, forming small rod-shaped deposits on the other electrode. Typically the arc-discharge process creates other components, and thus generally requires additional purification to produce pure SWNTs. High-quality SWNT films also may be produced using nanotubes synthesized via laser ablation.

According to the present invention, at least one electrode or other layer of an optoelectronic device may include a thin film of SWNTs. The film may be deposited on a substrate of the device by using an elastomeric stamp. The film may be enhanced by spin-coating a smoothing layer on the film and/ or doping the film to enhance conductivity. Electrodes according to the present invention may have conductivities, transparencies, and other features comparable to other materials typically used as electrodes in optoelectronic devices. The electrodes may have a sheet resistance of not more than 500Ω/□, 200Ω/□, not more than 180Ω/□, and not more than 160Ω/□, at transparencies of at least 75%, at least 80%, at least 87%, and at least 90%.

A vacuum filtration method was used to prepare SWNT films from commercially-available SWNTs. HiPCO and P3 SWNTs were mixed with 1 wt % aqueous sodium dodecyl sulfate (SDS) to make a highly-dense SWNT suspension with a typical concentration of 1 mg/mL. As used herein, a SWNT "suspension" includes a suspension, dispersion, colloidal dispersion, or other mixture where the nanotubes are generally evenly or roughly evenly distributed within a liquid. Typically the nanotubes are not dissolved, though an SDS surfactant may be added to a SWNT suspension to improve the solubility of SWNTs by sidewall functionalization.

Figure 3A:
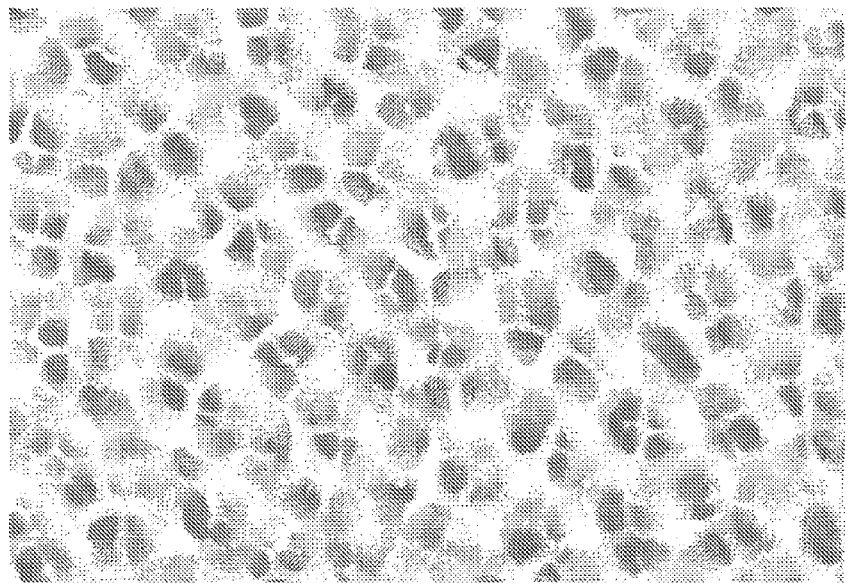
FIG. 3A shows a porous alumina filtration membrane used to fabricate a thin film of nanotubes.
Figure 3B:
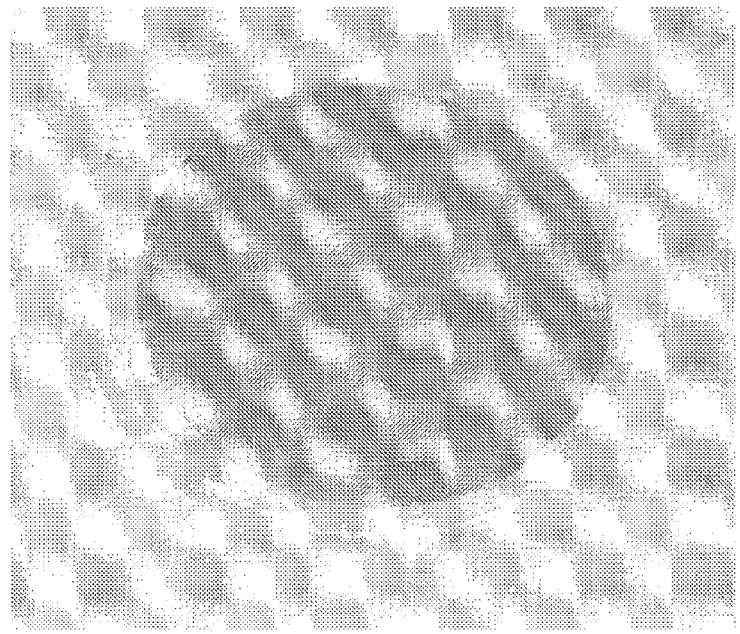
FIG. 3B shows a thin film of nanotubes.

After preparing the suspension, the concentrated SWNT suspension was then ultrasonically agitated using a probe sonicator for about 10 minutes, followed by centrifugation to separate out undissolved SWNT bundles and impurities. To make a uniform SWNT film, the as-produced suspension was further diluted by a factor of 30 with deionized water and filtered through a porous alumina filtration membrane (Whatman, 200 nm pore size) as shown in FIG. 3A. As the solvent went through the pores, the SWNTs were trapped on the membrane surface, forming a homogeneous grey layer as shown in FIG. 3B. This film-forming approach leads to greater production efficiency compared to previous methods, as one can produce a large quantity of the highly concentrated SWNT suspension. This simplicity may be at least partly attributed to the use of a probe sonicator, which significantly facilitated the dispersion of SWNTs in the aqueous SDS solvent.

Previous approaches, such as described in Z. Wu et al., "Transparent, Conductive Carbon Nanotube Films," *Science*, 2004, v. 305, p. 1273, the disclosure of which is incorporated by reference in its entirety, require dissolving the filtration membrane in wet chemicals to release the SWNT film. The present invention may use a dry method to transfer the SWNTs from the filtration membrane to target substrates. The dry-transfer approach uses an adhesive, soft and flat poly(dimethysiloxane) (PDMS) elastomeric stamp to peel the SWNT film off the filtration membrane and then release it onto a desired substrate, as illustrated in FIGS. 4A-4B. A SWNT film 430 may be pulled off a filtration membrane 410 using an elastomeric stamp 420. The film 430 may be transferred to another substrate 440 by applying the elastomeric stamp 420 to the substrate 440. A similar process is described in further detail in Y. Zhou et al., "A method of printing carbon nanotube thin films," *Applied Physics Letters*, v. 88, p. 123109 (2006), the disclosure of which is incorporated by reference in its entirety. The press printing may use mild heating during contact (100° C. for 1 min) to improve the adhesion of the target substrates. Using this technique, complete SWNT film transfer to glass (FIG. 4C) and flexible polyester (PE) substrates (FIG. 4D), has been demonstrated, allowing for use as transparent conductive electrodes for OLEDs, organic photovoltaic devices, or other optoelectronic devices. FIG. 4C shows a transparent 40 nm thick SWNT film on a 2" diameter glass substrate. FIG. 4D shows a flexed SWNT film on a PE sheet. In FIGS. 4C and 4D, a sheet of paper with "USC" printed on the surface is placed under the nanotube films to illustrate the transparency of the film.

Figure 5A:
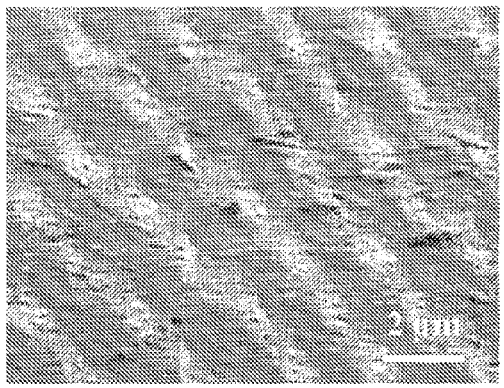
FIG. 5A is a perspective view SEM image of a thin film of HiPCO single-wall nanotubes.
Figure 5B:
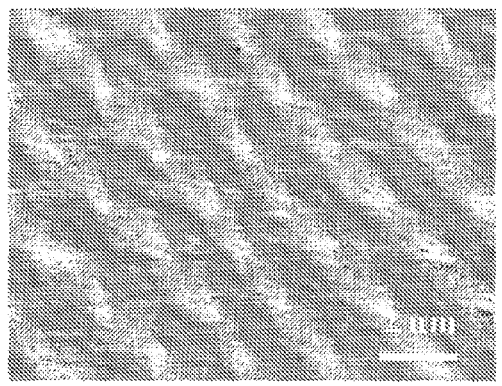
FIG. 5B is a perspective view SEM image of a thin film of P3 single-wall nanotubes.
Figure 5C:
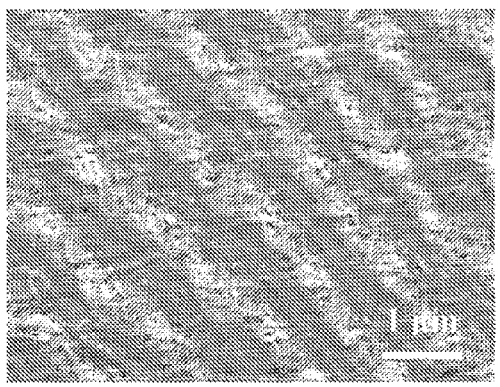
FIG. 5C shows a top view SEM image of the nanotube film illustrated in FIG. 5A.
Figure 5D:
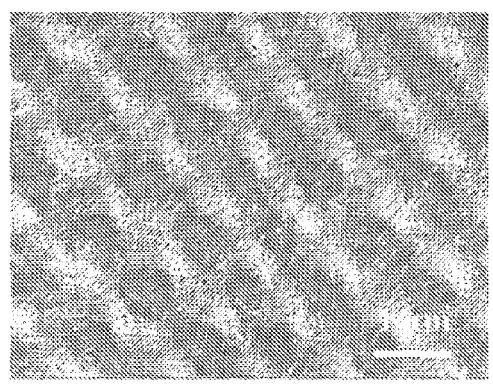
FIG. 5D shows a top view SEM image of the nanotube film illustrated in FIG. 5B.
Figure 5E:
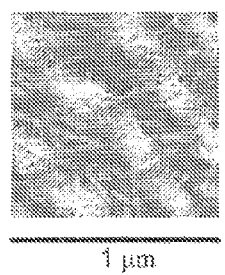
FIG. 5E shows an enlarged view of the image shown in FIG. 5C.
5F shows an enlarged view of the image shown in FIG. 5D.
Figure 5F:
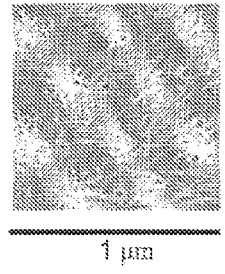
FIG. 5G shows the resistance at various transparencies for HiPCO and P3 nanotube films.
Figure 5G:
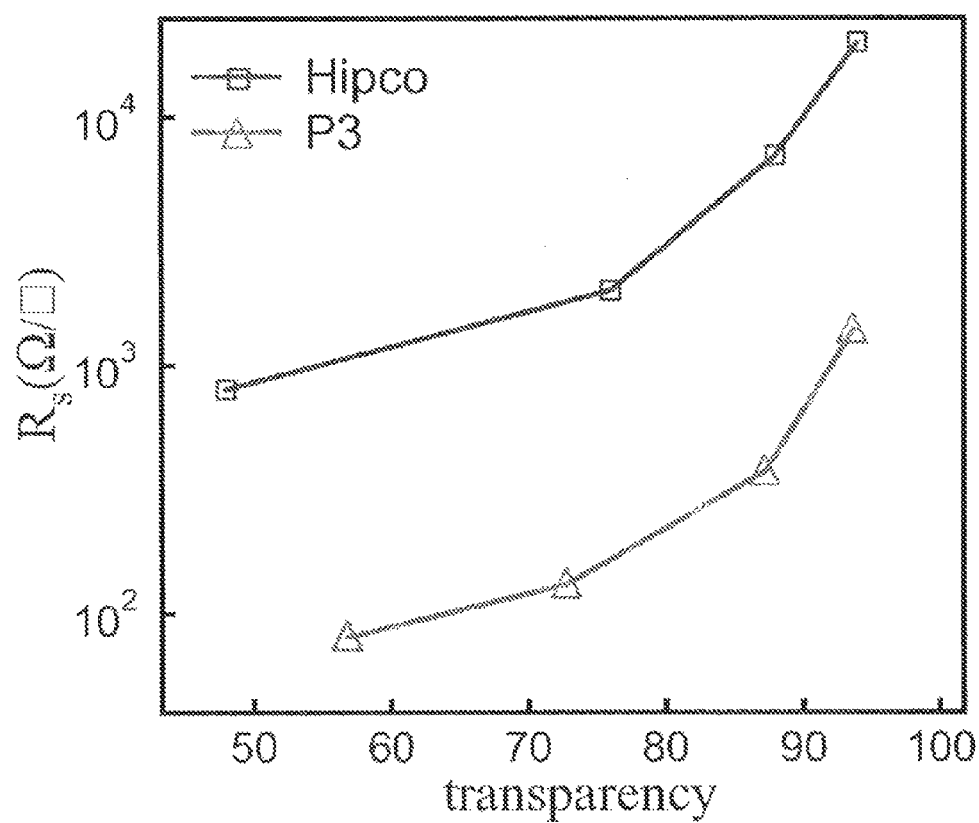

FIGS. 5A-5G compare the surface morphology and electrical conductance of the as-prepared HiPCO and P3 SWNT films. FIGS. 5A and 5B are perspective-view (60° from the normal direction) SEM images of SWNT films made of HiPCO and P3 nanotubes, respectively. While the P3 SWNTs form a rather dense and homogeneous network, HiPCO nanotube films display a number of "bumps" distributed on the film surface, which presumably result from the impurities or bundled nanotubes in the HiPCO product. The difference in surface quality is also revealed by FIGS. 5C and 5D, which show top-view SEM images of the HiPCO and P3 nanotubes, respectively. FIGS. 5E and 5F show enlarged views of the images shown in FIGS. 5C and 5D, respectively. The HiPCO SWNT film shows a higher roughness level due to the nanotubes and impurities protruding from the surface, whereas P3 nanotubes tend to bind to the supporting substrate conformally, forming a smooth network. Furthermore, we have observed that P3 SWNT films consistently exhibit much higher sheet conductance than HiPCO nanotubes by more than one order of magnitude at similar optical transparency. This is illustrated by the data shown in FIG. 5G, which shows the resistance at various transparencies for the HiPCO (squares) and P3 (triangles) nanotube films. The origin of this difference may be related to several factors, including difference in the nanotube dimension, the defect density, the presence of resistive impurities, the ease of separating bundled nanotubes, and also the relative abundance between metallic and semiconductive nanotubes. A comprehensive comparison between the two types of commercial SWNTs is shown in Table 1. It has been found that, in general, P3 SWNT films outperform HiPCO nanotubes in all critical aspects including the surface smoothness, sheet conductance, and the stability of optoelectronic devices, as discussed below. The lifetime of the OLED incorporating the P3 film represents a lower limit based determined by the measurement time.

TABLE 1

| | Roughness (nm) | $R_s$ at 87% Transp. (Ω) | Lifetime of OLED |
|---|---|---|---|
| HiPCO | 11 | 7200 | <30 s |
| P3 | 7 | 380 | >4-5 hrs. |

Figure 6A:
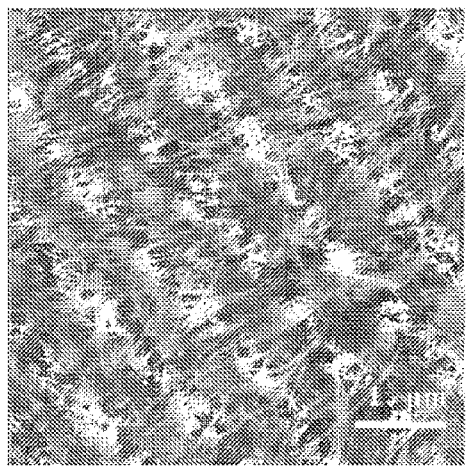
FIG. 6A shows an AFM image of a P3 SWNT film on glass.

Further examination of the surface roughness of the SWNT films was carried out using atomic force microscopy (AFM). FIG. 6A shows an AFM image of a P3 SWNT film on glass, confirming the formation of dense and homogeneous network of interconnected SWNTs. The average surface roughness of typical pristine P3 SWNT films is around 7 nm as measured for five different samples with similar thickness (~40 nm, determined by AFM at step edges). This degree of roughness compares favorably with that of nanotube films based on HiPCO nanotubes, which have a typical roughness of 11 nm, as listed in Table 1.

Figure 6B:
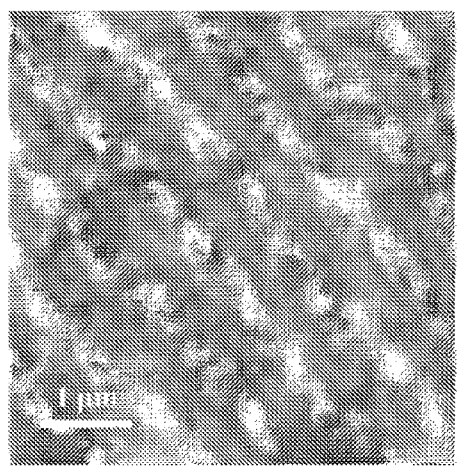
FIG. 6B shows an AFM image of a P3 SWNT film after spin-coating.
Figure 6C:
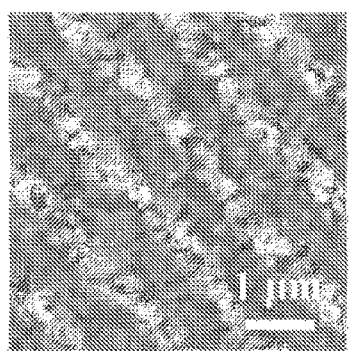
FIG. 6C shows an AFM image of a layer of a standard ITO film.

To further reduce the roughness of the P3 SWNT film and ensure uniform light emission across the OLED surface, poly (3,4-ethylenedioxythiophene) (PEDOT), was spin-coated onto the film to smooth the sample surface. As seen in the AFM image in FIG. 6B, (lie SWNT film shows a pronounced improvement in surface flatness, with a substantially reduced (rms) roughness of 3.1 nm after PEDOT spin-coating (100 Å). This degree of surface roughness is comparable to that of standard ITO films, which is 2.4 nm as derived from the AFM image in FIG. 6C.

Figure 7A:
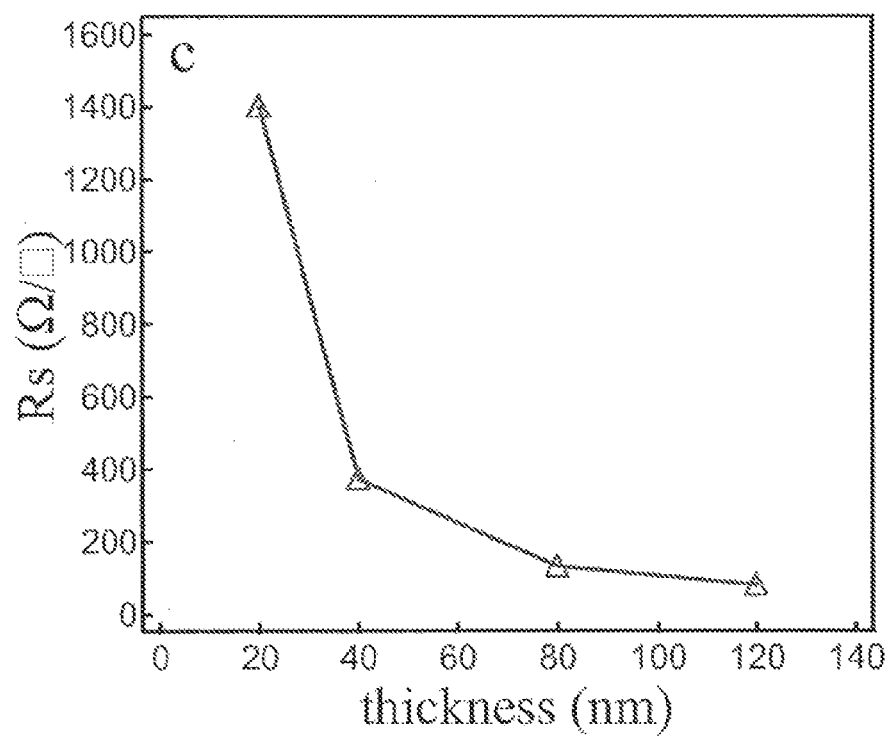
FIG. 7A shows sheet resistance of P3 SWNT films as a function of film thickness.
Figure 7B:
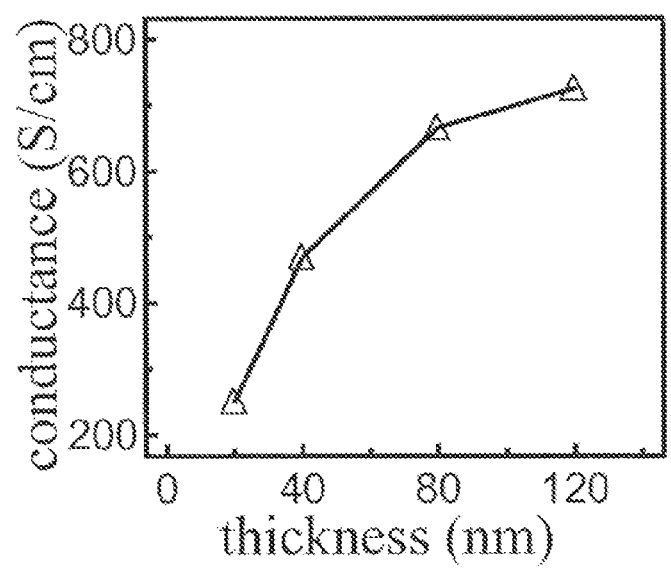
FIG. 7B shows the electrical conductivity of P3 SWNT films as a function of film thicknesses.

Four-probe dc measurements were performed on four different P3 SWNT films. FIG. 7A shows sheet resistance ($R_s$) of the films as a function of film thickness (t). The sheet resistance was further converted to electrical conductivity, defined as $\sigma=1/R_s t$. The σ vs. t curve, shown in FIG. 7B, shows a monotonic increase with a tendency to saturate at greater thicknesses. The highest conductivity is 733 S/cm for the 120 nm film, about two times higher than the saturation conductivity (400 S/cm) of conventional P3 SWNT films prepared by spraying. Both values are far below the axial conductivity of 10000-30000 S/cm typically observed for SWNT ropes due to the lack of alignment and the presence of highly resistive inter-tube junctions in the random SWNT networks. In is believed that the conductivity of the SWNT film may be determined by the density of conducting channels in the random network, which is expected to scale as the concentration of low-resistance inter-tube junctions formed by metallic SWNTs. The semiconductive-semiconductive and metallic-semiconductive inter-tube junctions, in comparison, make less contribution to the overall conductivity due to the high Schottky barriers formed at the interfaces. Adding SWNTs into an initially sparse network may cause significant increase in the concentration of the metallic-metallic junctions, resulting in an increase in conductivity at small thicknesses. As the SWNT network becomes increasingly compact, the concentration of such conductive junctions tends to saturate in thick films, which eventually leads to the saturation in electrical conductivity.

Figure 8A:
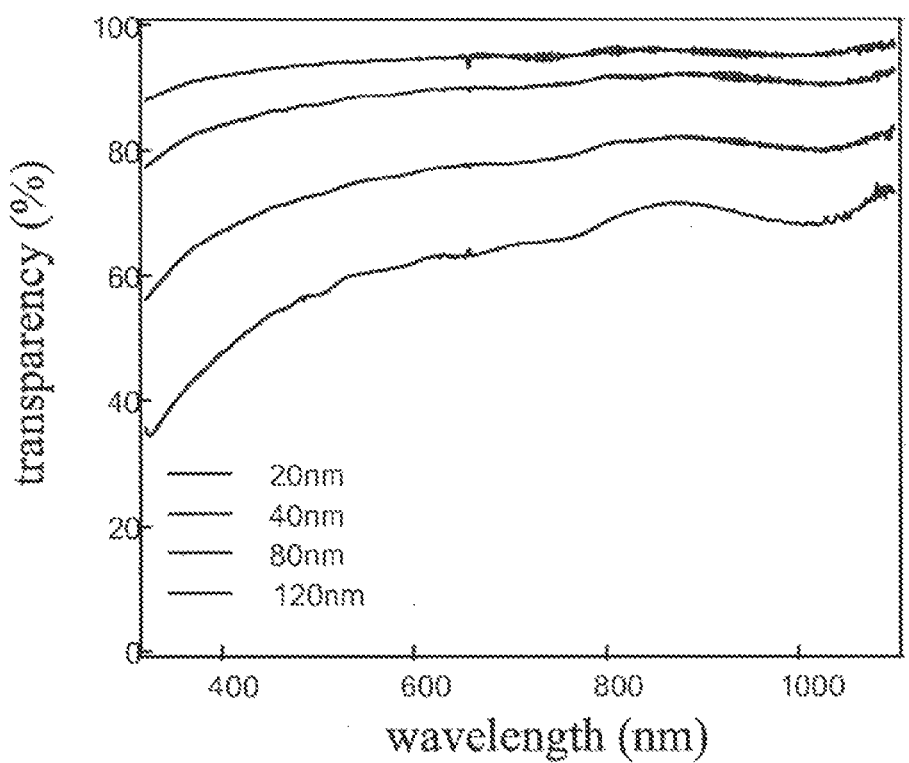
FIG. 8A shows the transmittance spectra of P3 SWNT films.
Figure 8B:
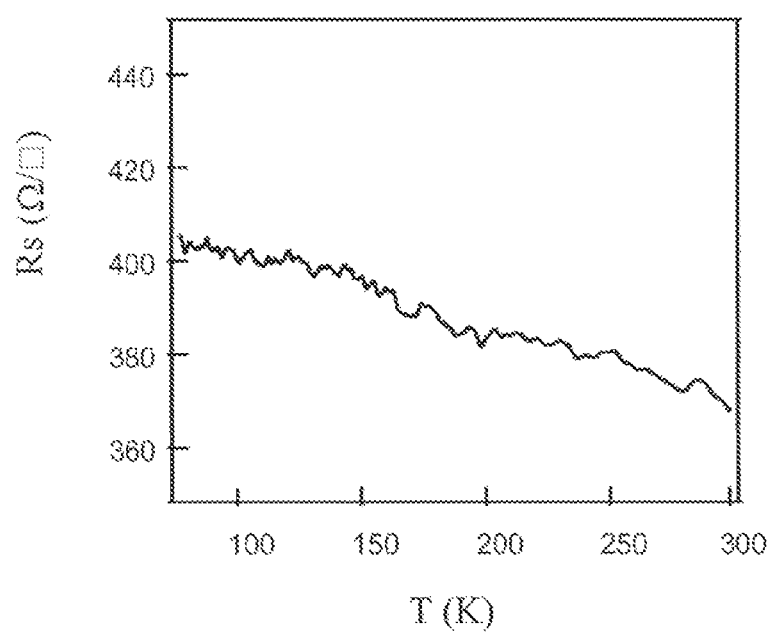
FIG. 8B shows sheet resistance of P3 SWNT films as a function of temperature.

In comparison with the saturation conductivity of conventional sprayed P3 SWNT films (400 S/cm), the higher conductivity (733 S/cm) observed in films according to the present invention is a result of the press-printing method, which may produce more compact SWNT networks compared to the spray approach. FIG. 8A shows the transmittance spectra of the four SWNT films. Within the spectrum range from 300 to 1100 nm, the transmittance shows a monotonic increase in the visible region and becomes relatively flat in the near-infrared. The 20 and 40 nm films exhibit sufficiently high transmittance to visible light (93% and 87% @ 520 nm), which is comparable to that of typical ITO films (~90%). The microscopic view of the SWNT film conductivity is also supported by the temperature dependence, shown in FIG. 8B, in which the sheet resistance of the 40 nm film shows a very slight increase (10%) as temperature decreases from 290 to 77 K. It is believed that the nonmetallic behavior and the weak temperature dependence are due to the series conduction through. the metallic SWNTs that are interrupted by small tunnel barriers at the junctions.

Figure 9A:
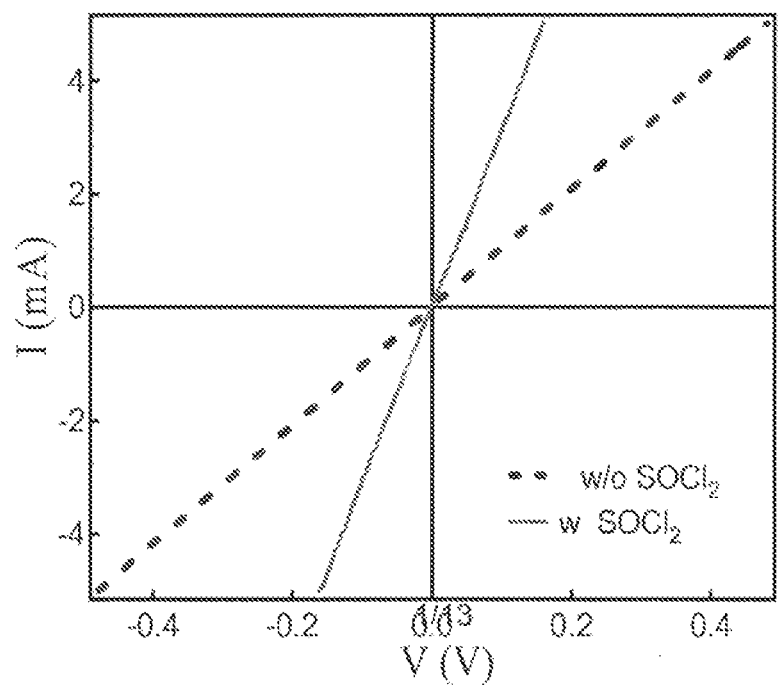
FIG. 9A shows four-probe I-V curves of P3 SWNT films before and after $SOCl_2$ incubation.
Figure 9B:
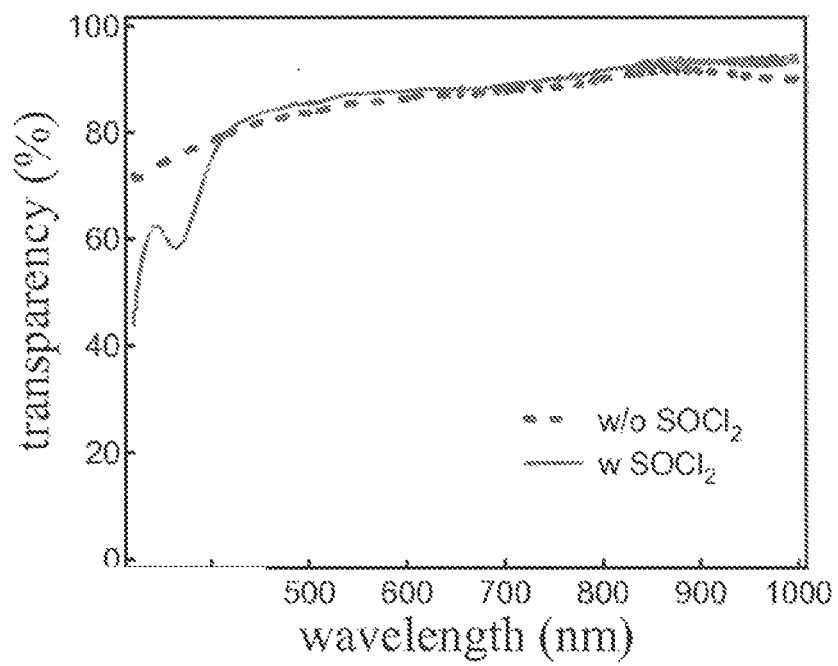
FIG. 9B shows the transmittance spectra of P3 SWNT films before and after $SOCl_2$ treatment.

It is often desirable for electrodes in optoelectronic devices to have a high conductivity to distribute a uniform electrical potential across the polymer surface. To enhance the conductivity of the SWNT films while retaining their high transparency, the films were chemically doped using thionyl chloride ($SOCl_2$), a liquid organic solvent with remarkable reactivity toward graphite surfaces and SWNTs. The $SOCl_2$ treatment was performed by immersing the P3 SWNT films in $SOCl_2$ (Aldrich) for 12 hours followed by drying in $N_2$ flow. FIG. 9A shows the four-probe I-V curves taken before and after the $SOCl_2$ incubation, in which the treated film shows a significant increase in conductance by a factor of 2.4. It is believed that this effect is due to the strongly oxidizing nature of $SOCl_2$, which exhibits remarkable electron-withdrawing ability when adsorbed on the surface of SWNTs. This conductivity enhancement effect is not limited to p-type semiconductive SWNTs. It is believed that the significant charge transfer induced by $SOCl_2$ (~0.1 electrons per adsorbate) could also enable Fermi level shifting into the van Hove singularity region of metallic SWNTs, resulting in a substantial increase in the density of states at the Fermi level. Moreover, the results described herein indicate that, despite the significant modification in their electrical properties, the treatment with $SOCl_2$ has a negligible effect on the optical adsorption of SWNTs in the visible spectrum. This is illustrated by the data presented in FIG. 9B, which shows the transmittance spectrum of the SOCl$_2$-treated sample and of a pristine P3 SWNT film. With this doping technique, the optimized films show a typical sheet resistance of about 160Ω/□ at 87% transparency. It is believed that resistances of about 200Ω/□, 180Ω/□, 160Ω/□, 100Ω/□, and 20Ω/□ at transparencies of 75%, 80%, 87%, and 90% are achievable using the methods and systems described herein. Specifically, it is believed that the present invention may provide for layer resistances of less than 160Ω/□ at 80% transparency, less than 100Ω/□ at 80% transparency, less than 200Ω/□ at 90% transparency, less than 160Ω/□ at 80% transparency, and less than 160Ω/□ at 90% transparency. Other values also may be achievable in devices according to the present invention.

Figure 10A:
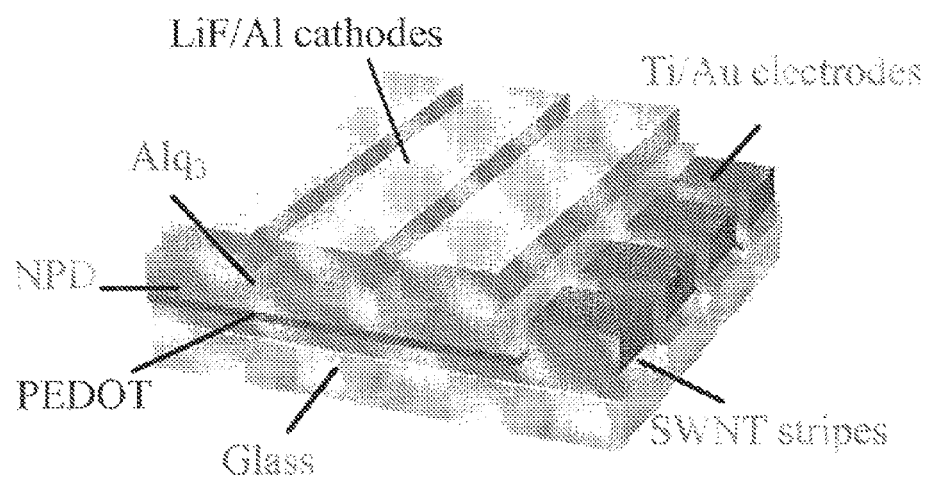
FIG. 10A shows a schematic diagram of an optoelectronic device having a SWNT film layer.
Figure 10B:
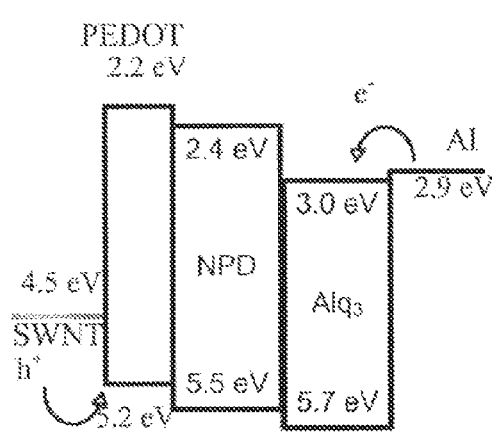
FIG. 10B shows an energy level diagram of the device illustrated in FIG. 10A.
Figure 10C:
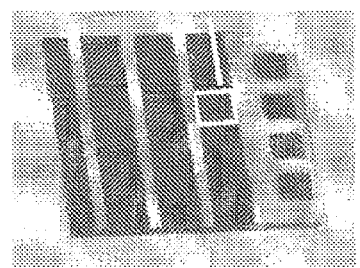
FIG. 10C shows a photograph of an optoelectronic device having a SWNT film layer.

According to the present invention, the optimized SWNT films may be used in hole injection electrodes in optoelectronic devices on both rigid glass and flexible plastic substrates. An exemplary OLED is illustrated in FIG. 10A. To fabricate multiple pixels on a single device, the continuous SWNT film was first patterned into 1.5 mm-wide stripes by selective O$_2$ plasma etching. As an optional step, Ti/Au electrode was deposited at the end of each SWNT stripe to facilitate external connections. PEDOT was then spin-coated on the SWNT film to form a 200 Å-thick hole-injection buffer layer. After annealing in vacuum for 20 minutes, 500 Å N,N'-Di-[(1-naphthalenyl)-N,N'-diphenyl]-1,1'-biphenyl)4,4'-diamine (NPD) and 500 Å Tris (8-hydroxyquinolinato) aluminum (Alq$_3$) were successively deposited via thermal evaporation, forming the hole-transport and emission layers of the OLED. In the final step, the top cathodes were added by consecutive deposition of 10 Å LiF and 1200 Å Al through a shadow mask. An energy level diagram for the exemplary device is shown in FIG. 10B. A photograph of the completed device (on glass substrate) is shown in FIG. 10C.

Figure 11A:
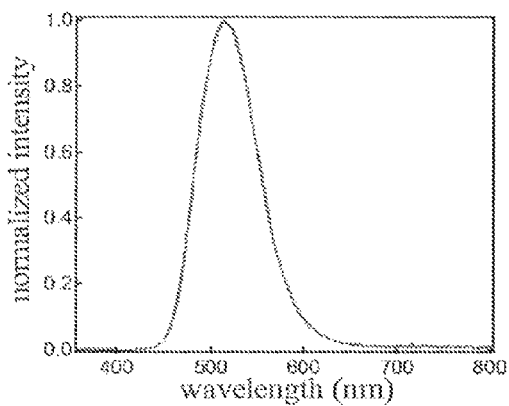
FIG. 11A shows the photoluminescence spectrum of $Alq_3$.
Figure 11B:
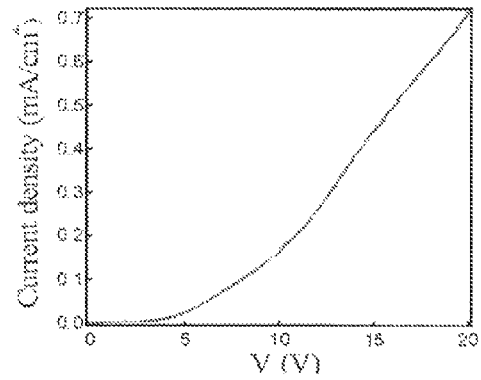
FIG. 11B shows the current-voltage curve of an OLED having a SWNT film layer.
Figure 11C:
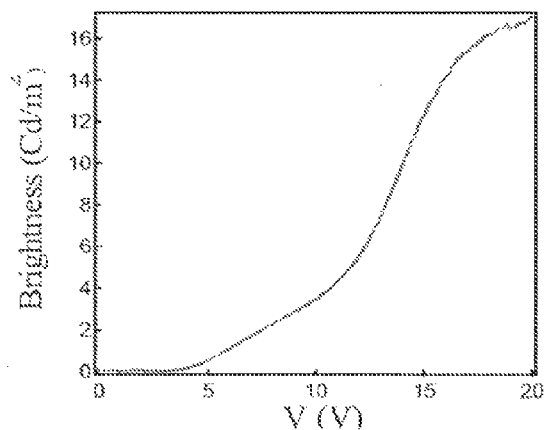
FIG. 11C shows the brightness of an OLED having a SWNT film layer as a function of the voltage bias.
Figure 11D:
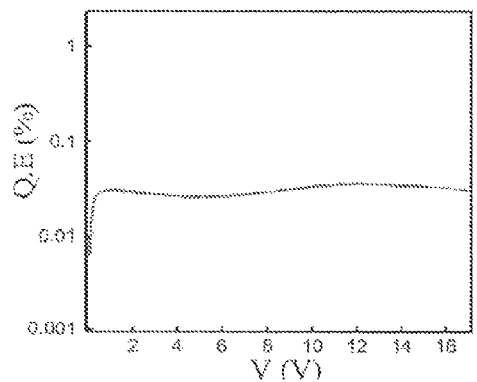
FIG. 11D shows the quantum efficiency of an OLED having a SWNT film layer as a function of voltage bias.

FIG. 11A shows the photoluminescence spectrum of Alq$_3$, with a single peak centered at 520 nm. As previously described, the transparency of the SWNT electrode (40 nm thick) at this wavelength is about 87%. The current-voltage curve of the OLED was recorded with a Keithtey 2400 source-meter and is shown in FIG. 11B. The current density, derived using a device area of 2 mm$^2$, showed a monotonic but nonlinear increase with the voltage bias and reaches 0.7 mA/cm$^2$ at 20 V. An increase in brightness was accompanied with increasing current density, as measured using a Newport optical meter (Model 1835C). FIG. 11C shows the brightness as a function of the voltage bias; detailed luminance characterization showed a threshold voltage of 5 V and a brightness of 17 cd/m$^2$ at 20 V. FIG. 11D shows the quantum efficiency as a function of voltage bias, which varied between 0.21% and 034% within a wide bias range from 0.6 to 20 V.

The exemplary OLED devices based on P3 nanotube films exhibited high stability and long lifetime, as no degradation in light emission was observed within four to five hours. This represents a lower limit imposed by the measurement time used during the experiments; in practice the device lifetime can be much longer than 4-5 hours. In contrast, similar devices made with HiPCO nanotube films typically exhibit a lifetime shorter than 30 seconds before becoming either open or short circuits. This remarkable difference is a combined effect of the difference in surface roughness and sheet conductance. As previously described and illustrated, HiPCO films typically are much rougher than P3 films, and the "bumps" in the HiPCO films can lead to local heating and filament formation, and eventually result in thermal damage and short/open circuits. The relatively high sheet resistance of the HiPCO films may further hamper the reliability of the OLED devices, as higher voltage is needed to operate the HiPC®-based OLED devices than the P3-based counterparts.

It was also found that, even for devices based on P3 nanotube films, the observed current density and brightness are lower than those of ITO-based OLEDs of the same structure (ITO/500 Å NPD/500 Å Alq$_3$/LiF/Al), by 1-2 orders of magnitude. This may be related to both the higher sheet resistance of the nanotube films as well as the lower work function of nanotubes (about 4.5 eV for nanotubes, compared to about 4.8 eV for ITO), which leads to a higher hole-injection barrier and also accounts for the suppressed current density and brightness observed during the experiments.

The experiments described herein demonstrate that arc-discharge nanotubes form far more homogeneous and conductive networks than HiPCO nanotubes, and can result in optoelectronic devices with longer lifetimes. It was found that polymer passivation and SOCl$_2$ doping to further reduce the surface roughness and sheet conductance of the SWNT films may further optimize the films, providing typical sheet resistance of ~160Ω/□, 87% transparency, and surface roughness comparable to that of ITO substrates. It was found that the choice of material and surface roughness of the resulting film has a noticeable effect on the success of the application, as films based on arc discharge nanotubes are demonstrably better than films based on HiPCO nanotubes in a variety of aspects, including the surface roughness, sheet resistance, and transparency.

The efficacy of SWNT films as electrodes in organic photovoltaic devices was also examined. Vapor-deposited double-heterojunction organic photovoltaic devices using CuPc/C$_{60}$/bathocuproine photoactive regions were fabricated. Devices fabricated on 63% (550 nm) optically transmissive mats yielded a short-circuit current density ($J_{sc}$) of 2.2 mA/cm$^2$ and 0.32% power conversion efficiency at 100 mW/cm$^2$ AM1.5G illumination. This is comparable to the 2.0 mA/cm$^2$ $J_{sc}$ and 0.37% efficiency obtained from an identical device based on a 71% transmissive plastic/In$_2$O$_3$:Sn electrode, which shows that functional photovoltaic devices may be fabricated using SWNT electrodes. For devices using a charge recombination layer, such as tandem devices, it is believed that the present invention may be used to provide charge recombination layers, charge transfer layers, and/or other layers in such a device. In some configurations, the various layers in an optoelectronic device may use additional processing steps not described herein, as would be understood by one of skill in the art.

Figure 12:
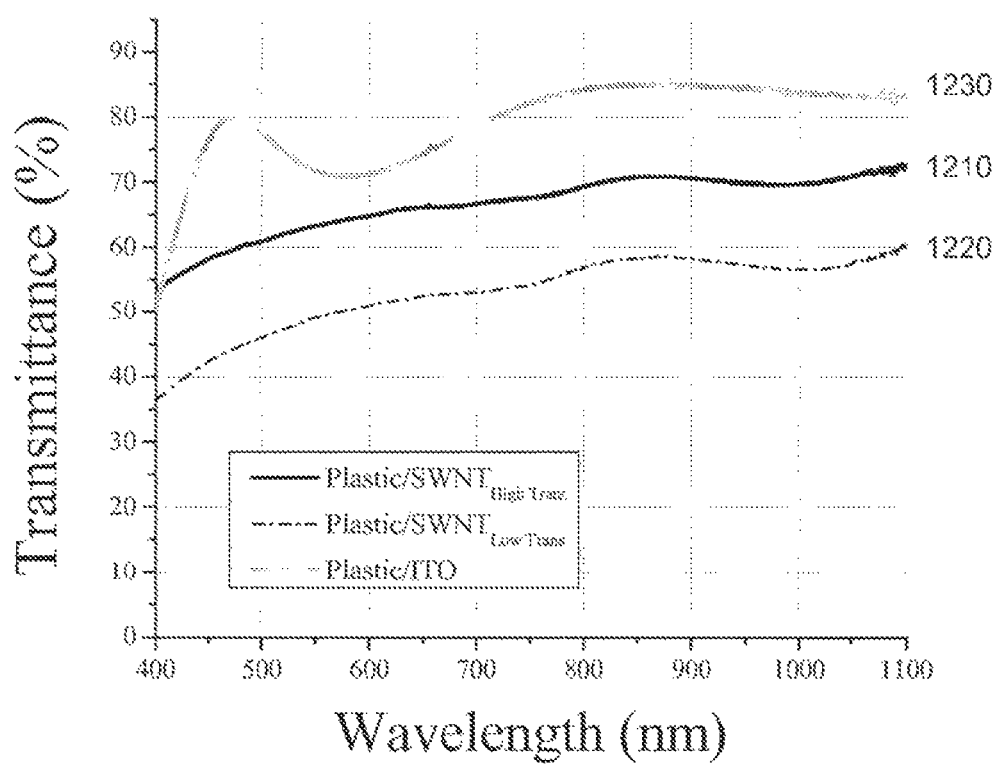
FIG. 12 shows optical transmittance spectra of SWNT and ITO transparent electrodes fabricated on plastic.

The transmittance curves in FIG. 12 show the optical transmittance of transparent electrodes fabricated on plastic. Transmittance curves for high-transmission SWNT on plastic (1210), low-transmission SWNT on plastic (1220), and ITO on plastic (1230) are shown.

Figure 13:
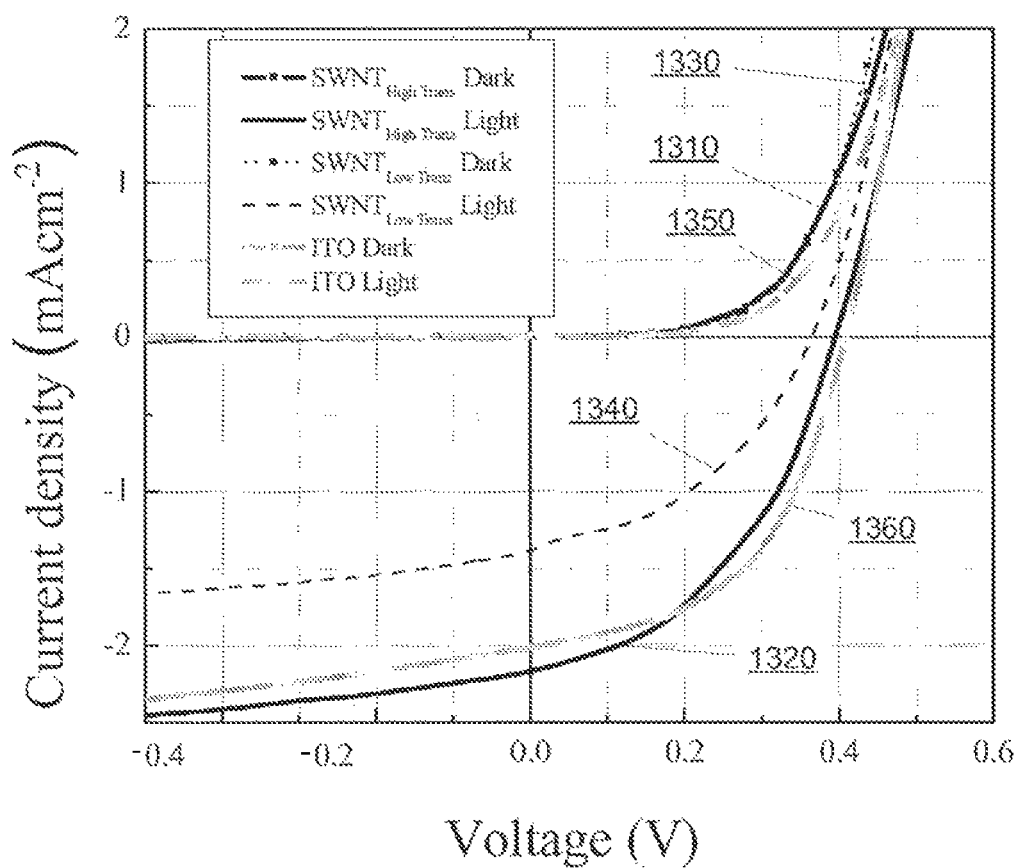
FIG. 13 shows current-voltage curves for devices with $CuPc/C_{60}$/bathocuproine photoactive regions on SWNT and ITO electrodes.

Devices with CuPc/C$_{60}$/bathocuproine photoactive regions were fabricated on electrodes exhibiting the optical transmittances presented in FIG. 12 and subjected to characterization. FIG. 13 shows the current-voltage curves for the following devices:

| | |
|---|---|
| High Trans. SWNT (Dark) | 1310 |
| High Trans. SWNT (Light) | 1320 |
| Low Trans. SWNT (Dark) | 1330 |
| Low Trans. SWNT (Light) | 1340 |
| ITO (Dark) | 1350 |
| ITO (Light) | 1360 |

The calculated parameters determined from the electrical characterization of these devices are presented in Table 2. The SWNT based devices exhibit surprisingly good photocurrent density considering their relatively low transmittance compared with the ITO coated plastic substrates. Notably, the photocurrent produced from the higher transmittance SWNT films is comparable to that of the devices based on ITO coated plastic. The $V_{OC}$ of all of the devices is approximately the same. It is believed that this is coupled to the mitigating effects of the PEDOT:PSS layer used to passivate the electrode surface and reduce shorting behavior. The fill factor (FF) of SWNT based devices is slightly reduced compared to their ITO based counterparts, which indicates that these devices suffer from losses due to a higher sheet resistance of the SWNT films compared to ITO. However, the FF is surprisingly high considering the large contact resistance to current flow that probably exists between adjacent nanotubes in the SWNT film.

TABLE 2

| Device Structure | $J_{SC}$ (mAcm$^{-2}$) | $V_{OC}$ (V) | FF |
| --- | --- | --- | --- |
| Plastic/ITO/Organic*/Al | 2.0 | 0.410 | 0.51 |
| Plastic SWNT$_{High\ Trans}$/Organic*/Al | 2.2 | 0.397 | 0.44 |
| Plastic SWNT$_{Low\ Trans}$/Organic*/Al | 1.4 | 0.365 | 0.43 |

*PEDOT: PSS/CuPc/C$_{60}$/BCP

The fill factor, FF, is defined as:

$$FF=\{I_{max}V_{max}\}/\{I_{SC}V_{OC}\}$$

where FF is always less than 1, as the short-circuit current $I_{SC}$ and the open circuit voltage $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P=FF*(I_{SC}*V_{OC})/P_{inc}$$

MATERIAL DEFINITIONS

| | |
| --- | --- |
| CBP | 4,4'-N,N-dicarbazole-biphenyl |
| m-MTDATA | 4,4',4''-tris(3-methylphenylphenlyamino)triphenylamine |
| Alq$_3$ | 8-tris-hydroxyquinoline aluminum |
| Bphen | 4,7-diphenyl-1,10-phenanthroline |
| n-Bphen | n-doped BPhen (doped with lithium) |
| F$_4$-TCNQ | tetrafluoro-tetracyano-quinodimethane |
| p-MTDATA | p-doped m-MTDATA (doped with F$_4$-TCNQ) |
| Ir(ppy)$_3$ | tris(2-phenylpyridine)-iridium |
| Ir(ppz)$_3$ | tris(1-phenylpyrazoloto,N,C(2')iridium(III) |
| BCP | 2,9-dimethyl-4,7-diphenyl-1,10-phenanthroline |
| TAZ | 3-phenyl-4-(1'-naphthyl)-5-phenyl-1,2,4-triazole |
| CuPc | copper phthalocyanine |
| ITO | indium tin oxide |
| NPD | N,N'-diphenyl-N-N'-di(1-naphthyl)-benzidine |
| TPD | N,N'-diphenyl-N-N'-di(3-toly)-benzidine |
| BAlq | aluminum(III)bis(2-methyl-8-hydroxyquinolinato)4-phenylphenolate |
| mCP | 1,3-N,N-dicarbazole-benzene |
| DCM | 4-(dicyanoethylene)-6-(4-dimethylaminostyryl-2-methyl)-4H-pyran |
| DMOA | N,N'-dimethylquinacridone |
| PEDOT: PSS | an aqueous dispersion of poly(3,4-ethylenedioxythiophene) with polystyrenesulfonate (PSS) |
| hfac | hexafluoroacetylacetonate |
| 1,5-COD | 1,5-cyclooctadiene |
| VTES | vinyltriethylsilane |
| BTMSA | bis(trimethylsilyl)acetylene |
| Ru(acac)$_3$ | tris(acetylacetonato)ruthenium(III) |
| C$_{60}$ | Carbon 60 ("Buckminsterfullerene") |

The simple layered structures described and illustrated herein are provided by way of non-limiting example, and it is understood that embodiments of the invention may be used in connection with a wide variety of other structures. The specific materials and structures described are exemplary in nature, and other materials and structures may be used. Functional optoelectronic devices according to the invention also may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, a hole transport layer may transport holes and inject holes into an emissive layer, and may be described as a hole transport layer or a hole injection layer. An optoelectronic device according to the invention also may be described as having an "organic layer" disposed between a cathode and an anode. This organic layer may comprise a single layer, or may further comprise multiple layers of different organic materials as described, for example, with respect to FIGS. 1 and 2. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in Published U.S. Pat. No. 7,196,835 to Peumans et al., which is incorporated herein by reference in its entirety.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, solar cells, photodetectors, photodetector arrays, photosensors, vehicles, large-area wall, theater or stadium screens, signs, and phototransistors, including products that include one or more photovoltaic devices such as solar power systems, solar-powered calculators, road signs, cameras, and cell phones. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.). Many photovoltaic devices typically operate in temperatures up to 100-150° C. Other temperature ranges may be used.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

What is claimed is:

1. A method for manufacturing an optoelectronic device, comprising:
    preparing a suspension of nanotubes;
    filtering the suspension to form a thin film of nanotubes on a filtration membrane;
    doping the thin film of nanotubes with $SOCl_2$;
    depositing the thin film over a substrate forming a first electrode of the optoelectronic device;
    depositing a smoothing layer on the thin film of nanotubes;
    depositing an organic layer over the smoothing layer; and
    depositing a second electrode of the optoelectronic device over the organic layer.

2. The method of claim 1, wherein doping the thin film of nanotubes with $SOCl_2$ comprises immersing the thin film of nanotubes on the filtration membrane in $SOCl_2$ solvent.

3. The method of claim 2, further comprising drying the thin film of nanotubes in $N_2$.

4. The method of claim 2, wherein the thin film of nanotubes on the filtration membrane is immersed in $SOCl_2$ solvent for twelve hours.

5. The method of claim 4, further comprising drying the thin film of nanotubes in $N_2$.

6. The method of claim 1, wherein depositing the thin film of nanotubes over the substrate comprises:
    transferring the thin film from the filtration membrane to an elastomeric stamp; and
    pressing the elastomeric stamp onto the substrate to transfer the thin film from the elastomeric stamp to the substrate.

7. The method of claim 1, wherein preparing the suspension of nanotubes comprises agitating the suspension.

8. The method of claim 7, wherein the suspension is agitated ultrasonically.

9. The method of claim 1, wherein preparing the suspension comprises functionalizing the nanotubes in the suspension.

10. The method of claim 1, wherein the nanotubes are arc discharge nanotubes.

11. The method of claim 1, wherein depositing the smoothing layer comprises spin-coating the smoothing layer on the thin film.

12. The method of claim 11, wherein the thin film is smoothed to an rms roughness of not more than 3.1 nm after the smoothing layer is deposited.

13. The method of claim 1, further comprising patterning the thin film to form a plurality of pixels of the optoelectronic device.

14. The method of claim 1, wherein the organic layer is an emissive layer.

15. The method of claim 1, wherein the organic layer is a photoactive layer.

* * * * *